(12) United States Patent
Seitz (10) Patent No.: US 7,038,235 B2
(45) Date of Patent: May 2, 2006

(54) INTEGRATED-OPTICAL MICROSYSTEM BASED ON ORGANIC SEMICONDUCTORS

(75) Inventor: Peter Seitz, Urdorf (CH)

(73) Assignee: CSEM Centre Suisse D'Electronique et de Microtechnique SA, Neuchatel (CH)

( * ) Notice: Subject to any disclaimer, the term of this patent is extended or adjusted under 35 U.S.C. 154(b) by 46 days.

(21) Appl. No.: 10/462,439

(22) Filed: Jun. 16, 2003

(65) Prior Publication Data
US 2003/0230768 A1 Dec. 18, 2003

(30) Foreign Application Priority Data
Jun. 17, 2002 (EP) ................. 02 405 494

(51) Int. Cl.
*H01L 35/24* (2006.01)
(52) U.S. Cl. .......................... 257/40; 438/99
(58) Field of Classification Search ............. 257/40; 438/99
See application file for complete search history.

(56) References Cited

U.S. PATENT DOCUMENTS

| | | | |
|---|---|---|---|
| 5,367,597 A | * | 11/1994 | Palmskog .............. 385/129 |
| 5,670,792 A | | 9/1997 | Utsugi et al. |
| 5,907,160 A | * | 5/1999 | Wilson et al. ........... 257/40 |
| 6,150,668 A | * | 11/2000 | Bao et al. ............... 257/40 |

FOREIGN PATENT DOCUMENTS

| | | |
|---|---|---|
| CA | 2328094 | 10/1999 |
| EP | 1 033 765 A2 | 9/2000 |
| EP | 1 164 641 A2 | 12/2001 |
| GB | 2 315 594 A | 2/1998 |

* cited by examiner

*Primary Examiner*—Long Pham
*Assistant Examiner*—Wai-Sing Louie
(74) *Attorney, Agent, or Firm*—Rankin, Hill, Porter & Clark LLP (57) ABSTRACT

The monolithic integration of all key photonic components (11–16) of an integrated-optical microsystem (1) based on organic semiconductors is disclosed. Examples of such components (11–16) are light sources (11), photodetectors (12), photovoltaic power generators (12), field-effect transistors (13, 14), resistors, capacitors (15), or waveguiding structures (11, 12). The components (11–16) are arranged on a common substrate (20), are compatible with each other, can be manufactured simultaneously and can be operated simultaneously. At least one of the components (11–14) comprises a layer (23) of organic semiconductor material. Each component (11–16) comprises a plurality of layers (21–26), at least one of which (21) has identical physical and chemical characteristics in at least two components (11–16). The large number and diversity of photonic devices that can be monolithically integrated allows a higher degree of integration, of functionality and of system complexity than was practical with the state of the art.

19 Claims, 5 Drawing Sheets

INTEGRATED-OPTICAL MICROSYSTEM BASED ON ORGANIC SEMICONDUCTORS

BACKGROUND OF THE INVENTION

1. Field of the Invention

This present invention generally relates to integrated-optical microsystems and, more particularly, to an integrated-optical microsystem based on organic semiconductors and to a method for manufacturing the same. An integrated-optical microsystem comprises at least two different electronic, photonic and/or micromechanic components arranged on a common substrate. Important examples of such components are monochromatic (laser) or polychromatic (LED) light sources, photodetectors, photovoltaic power generators, p-channel and n-channel field-effect transistors, resistors, capacitors, light-guiding or wave-guiding structures, or derived sensing devices for the measurement of pressure, magnetic or electric fields, chemical or biochemical substances, etc. Applications include self-powered posters or business cards, millimeter-thin large-area scanners and electronic paper.

2. Description of Related Art

Known techniques for the fabrication of microsystems rely on hybrid methods for the integration of the different functionalities required. Especially photonic microsystems, in which it is necessary to generate and detect light, consist of sub-systems that are manufactured with very different materials, using different types of technology. Light is generated usually with compound semiconductors such as GaAs, InP or InGaAsP. Light is often detected with inorganic semiconductors such as Si or Ge. Electronic circuits are realized with Si-based technologies such as complementary metal oxide semiconductor (CMOS) or bipolar. Passive optical components such as lenses, prisms or mirrors are realized with glass. Microoptical elements such as microlens arrays or diffractive optical components are fabricated with plastic materials, while the bodies and cases of complete systems are manufactured with metals or plastics.

It is known that passive optical functions can be combined with mechanical functions, using injection molding of polymers to produce so-called "optical monoblocks" (cf. P. Seitz, "*Real-time optical metrology for microsystems fabrication*", Proc. SPIE, Vol. 3825, pp 104–110, 1999). These integrated systems combine all passive optical elements (refractive, diffractive, reflective and obstructive) and all mechanical elements for assembly, mounting, and fixing in one piece of polymer that can be fabricated, for example, with a single injection-molding process.

It is also known that photosensitive elements, electronic devices, and circuits can be combined monolithically into "smart pixels" and "smart image sensors", preferably using silicon (cf. P. Seitz, "*Smart Image Sensors: An Emerging Key Technology for Advanced Optical Measurement and Microsystems*", Proc. SPIE, Vol. 2783, pp. 244–255, 1996). Due to the semiconductor properties of silicon it is difficult, however, to generate light within the same material used for the rest of the photosensitive and electronic devices.

The difficulty of generating light with silicon can be overcome by employing compound semiconductors, which make it possible to monolithically integrate photosensitive, photoemissive, analog, and digital electronic elements in so-called optoelectronic integrated circuits (OEICs) (cf. U. Kehrli, D. Leipold, K. Thelen, J. E. Epler, P. Seitz and B. D. Patterson, "*Monolithically Integrated-optical Differential Amplifiers for Applications in Smart Pixel Arrays*", IEEE J. Quantum Electronics, Vol. 32 (5), pp. 770–777, 1996).

Another, hybrid approach for overcoming the difficulty of generating light with silicon is described in U.S. Pat. No. 6,307,528 by D. Yap. A silicon substrate contains electronic circuits, and an organic semiconducting layer is deposited on top, with which light can be emitted under control of the underlying electronic circuits.

A hybrid solution for an optical head assembly based on an organic electroluminescent light-emitting array is described in U.S. Pat. No. 6,297,842 by M. Koizumi et al. The electronic circuits are contained in a silicon substrate, on top of which an organic semiconductor is deposited that generates light under control of the underlying circuits. These hybrid elements are then mounted on a printed circuit board to form a complete optical head assembly.

U.S. Pat. No. 5,770,446 by T. Sasaki et al. describes the monolithic combination of laser, optical amplifier, optical waveguide, optical modulator, and optical switch with a suitable selection of inorganic compound semiconductors such as InP and InGaAsP. Devices are formed with a sequence of selective crystal growth processes using demanding metallo-organic vapor phase epitaxy, photolithographic definition of structures, and suitable etching steps.

U.S. Pat. No. 6,228,670 by K. Kudo describes the monolithic combination of a highly integrated array of laser diodes, waveguides, and optical amplifiers. Devices are formed with a sequence of selective crystal growth processes using demanding metallo-organic vapor phase epitaxy, photolithographic definition of structures, and suitable etching steps.

From U.S. Pat. No. 6,300,612 by G. Yu it is known that photosensors based on organic semiconductors can be realized; this reference teaches the fabrication of a two-dimensional arrangement of individually addressable photodiodes. Since no means is foreseen for providing local amplification or electronic buffering, the noise performance of the described organic photosensors must be at least one order of magnitude below the performance of prior-art silicon-based photosensors.

SUMMARY OF THE INVENTION

It is an object of the invention to provide an integrated-optical microsystem based on organic semiconductors and a method of manufacturing such integrated-optical microsystem which overcome the limitations of the prior art. In particular, it is an object to manufacture the complete optical microsystem with one single process, avoiding cost for assembly and further hybrid system integration. Another object is to scale up the manufacturing process to very large surfaces of square meters. Still another object is to significantly reduce the production costs of optical microsystems compared with the prior art. Yet another object is to shape the resulting microsystems in three dimensions after an essentially planar fabrication. Still another object is to achieve a higher degree of integration, of functionality, and of system complexity than with the prior art.

These and other objects are solved by the integrated-optical microsystem and the manufacturing method according to the present invention.

The invention discloses the monolithic integration of all key photonic components of an integrated-optical microsystem based on organic semiconductors, in particular of monochromatic (laser) or polychromatic (LED) light sources, photodetectors, photovoltaic power generators, p-channel and n-channel field-effect transistors, resistors, capacitors, light guiding or wave guiding structures, as well as derived sensing devices for the measurement of pressure, magnetic or electric fields, chemical or bio-chemical substances, etc. In this connection the term "monolithic integration" means in this connections:

are arranged on a common substrate,
are compatible with each other,
can be manufactured simultaneously, and
can be operated simultaneously.

The integrated-optical microsystem according to the invention comprises a substrate and a plurality of components arranged on said substrate. At least a first of the components comprises a layer of organic semiconductor material. The first component and a second, different component are monolithically integrated on the substrate.

In a preferred embodiment of the integrated-optical microsystem according to the invention, the first component and said second component each comprise a plurality of layers, and said first component and said second component each comprise a corresponding layer with identical physical and chemical characteristics, and preferably with identical thicknesses and identical chemical and physical consistencies. Preferably, said first component and the second component each comprise a plurality of corresponding layers, the corresponding layers being mutually arranged in the vertical direction in the same order. The layers are, for example, selected from the group consisting of: a first and a second electrically conductive layer, one of the electrically conductive layers being a hole injection layer and one of the electrically conductive layers being an electron injection layer; an electrical insulation layer; an organic semiconductor layer; and a light-guide or wave-guide layer.

The method for manufacturing an integrated-optical microsystem according to the invention comprises the steps of providing a substrate and arranging a plurality of components on said substrate. At least a first of the components comprises a layer of organic semiconductor material. The first component and a second, different component are monolithically integrated on the substrate.

In a preferred embodiment of the method according to the invention, the process of monolithic integration of the first component and the second component comprises the fabrication of a plurality of layers, and a corresponding layer is fabricated simultaneously in the first component and the second component. Preferably, the process of monolithic integration of the first component and the second component comprises the fabrication of a plurality of corresponding layers in the first component and said second component, each corresponding layer being fabricated simultaneously in said first component and said second component. The layers are selected, e.g., from the group consisting of a first and a second electrically conductive layer, one of said electrically conductive layers being a hole injection layer and one of the electrically conductive layers being an electron injection layer; an electrical insulation layer; an organic semiconductor layer; and a light-guide or wave-guide layer.

The present invention of integrated-optical microsystems based on organic semiconductors overcomes the limitations of the described state of the art in all of the following respects:

Since the fabrication process is monolithic, the complete optical microsystem can be fabricated with it, avoiding any cost for assembly and further hybrid system integration.

The fabrication process can be scaled up to very large surfaces of square meters, and all technological steps to perform this are within the state of the art. This allows the fabrication of large-area optical microsystems or the simultaneous fabrication of a very large number of smaller optical microsystems.

Because of the economy of scale and the obsolete additional assembly steps, production costs of optical microsystems fabricated according to this invention can be significantly lowered.

The resulting microsystems can be arbitrarily shaped in three dimensions after essentially planar fabrication, provided a flexible substrate is used.

The large number and diversity of photonic devices that can be monolithically integrated allows a higher degree of integration, of functionality and of system complexity, than was practical with the state of the art.

Throughout this document, terms such as "light", "optical" or "photo . . . " refer to any kind of electromagnetic radiation, such as visible light, infrared (IR) or ultraviolet (UV) radiation.

BRIEF DESCRIPTION OF THE DRAWINGS

The invention is described in greater detail hereinafter relative to the attached schematic drawings, wherein.

DESCRIPTION OF PREFERRED EMBODIMENTS

FIG. 1 shows a schematic cross section through an integrated-optical microsystem 1 according to the invention. The microsystem 1 comprises at least two different electronic, photonic, and/or micromechanic components 11–16 arranged on a common substrate 20. The examples of such components 11–16 shown in FIG. 1 are: an integrated light-emitting device 11 (FIG. 1(a)); an integrated photodetector or photovoltaic cell 12 (FIG. 1(b)); an integrated n-channel field-effect transistor (FET) 13 (FIG. 1(c)); an integrated p-channel FET 14 (FIG. 1(d)); an integrated capacitor 15 (FIG. 1(e)); and/or an interconnect region 16 between two conductive layers (hole and electron injectors) (FIG. 1(f)). Of course, this list of examples is not exhaustive, and a person skilled in the art having knowledge of the invention will be able to derive many other components, including resistors, light-guiding or wave-guiding structures, or sensing devices for the measurement of pressure, magnetic or electric fields, chemical or bio-chemical substances, etc. These components may further be combined with other electronic, photonic and/or micromechanic components which are well-known from "classical" integrated-circuit (IC) technology.

The substrate 20 may be transparent or opaque, and may be rigid or flexible, depending on the envisaged application. Examples of structures usable as substrates 20 are the well-known silicon wafer, thin stainless steel foils, or transparent plastics such as polyester (PET, Mylar®), polyimide (Kapton®), polyamides (Nylon®), polypropylene or polyethylene.

The components 11–16 arranged on the common substrate 20 are compatible with each other, can be manufactured simultaneously and can be operated simultaneously. They are built up from a set of elements, typically structured layers 21–26 of various materials, examples of which are given in the following with reference to FIG. 1. Reference sign 21 denotes a hole injection layer that is transparent or opaque. Reference signs 22 and 24 denote a first and second insulation layer, respectively. Reference sign 23 denotes an active organic semiconductor layer. Reference sign 25 denotes an injection layer that is transparent or opaque. Reference sign 26 denotes a light-guiding or wave-guiding layer. Of course, this list of examples is not exhaustive, and a person skilled in the art having knowledge of the invention will be able to derive many other elements for building up the components, including diffusion from solution or gas phase and ion implant layers.

As is evident from FIG. 1, a component does not necessarily contain all of the set of elements 21–26, and the elements 21–26 may be differently structured in different components 11–16. However, due to the simultaneous manufacturing of the components 11–16, the corresponding layers 21–26 in each component 11–16 have the same thickness, the same chemical and physical consistency and are mutually arranged in the vertical direction z in the same order. These characteristics clearly distinguish a monolithic microsystem 1 according to the invention from a hybrid microsystem known from the prior art.

In the following, the steps and the process flow of a preferred embodiment of the manufacturing method according to the invention are explained with reference to FIG. 1.

(a) A planar substrate 20 is selected and provided, whose properties depend on the envisaged application of the optical microsystem to be manufactured. If the microsystem needs three-dimensional shaping after fabrication, then the substrate 20 must be flexible, otherwise it can be rigid. If light needs to penetrate the substrate 20, the substrate 20 must be optically transparent in the corresponding wavelength range, otherwise it can be opaque. Opaque substrate materials include crystalline silicon wafers or thin stainless steel foils; transparent substrate materials include polyester (PET, Mylar®), polyimide (Kapton®), polyamides (Nylon®), polypropylene or polyethylene.

(b) The substrate 20 is covered with a first conductive layer 21 that is capable of injecting holes into an organic semiconductor. A preferred material is indium tin oxide (ITO), which has also the advantage of being transparent. To improve hole transport and injection properties, the conductive hole-injecting material 21 can optionally be covered with a suitable hole-transporting layer such as PEDOT, poly(3,4-ethylenedioxythiophene).

(c) The first conductive layer 21 can act as the gate electrode of an n-channel field-effect transistor (FET). For this purpose, the first conductive layer 21 must be electrically insulated from subsequent covering layers with a first thin (1 to 200 nm thick) insulator 22. Examples of suitable insulating materials include $SiO_2$ (silicon dioxide), $Si_3N_4$ (silicon nitride), as well as any inorganic or organic semiconductors with a band gap of at least 2.5 eV. Geometric definition of the n-channel FET gates can be realized, for example, with known lithography-based techniques, such as wet etching, dry etching or lift off.

(d) An active material 23 of an organic semiconductor is deposited, such as PPP—poly (para phenylene), PPV—poly (para phenylene vinylene), Alq3—aluminum tris-(8, hydroxyquinoline), tetracene or pentacene. The deposition is effected with suitable techniques such as spin coating (for semiconducting polymers) or vacuum evaporation (for small semiconducting molecules) on the substrate 20 and/or the already deposited layers 21, 22. The preferred thickness of the organic semiconductor layer 23 is between 10 nm (to avoid photon losses and reduced quantum efficiencies) and 1000 nm (to respect the low mobilities and short life times of organic semiconductors). To improve the electronic mobility of the organic material 23, either globally or locally in selected regions, orientation techniques can be employed, as described in T. Uchida and H. Seki, "*Surface alignment of liquid crystals*", in "Liquid Crystals Applications and Uses", Vol. 3, Birendra Badahur (Ed.), Chapter 5, pp. 2–64, World Scientific Singapore, 1992, ISBN 981-02-0403-5. Mechanical, optical or magnetic orientation techniques are known for this purpose. The increase of electronic mobility in a selected direction is a useful property for the realization of FETs that are capable of faster switching and carrying higher currents, as well as for high-brightness light sources such as superluminescent diodes or electrically pumped lasers. If the organic semiconductor 23 has a high electronic mobility, the different, monolithically produced components 11–16 (such as shown in FIG. 1) must be separated from each other by restricting the organic semiconductor layers 23 to selected areas. Known emiconductor-processing techniques can be employed for this purpose. If the electronic mobility of the organic semiconductor 23 is low and the geometric distance between different components 11–16 is large, no geometrical separation might be necessary because the organic semiconductor material's 23 electrical resistance between components 11–16 is so high that it effectively insulates the components 11–16 from each other.

(e) In areas where the organic semiconductor 23 is used as the bulk of a p-channel FET, the organic semiconductor layer 23 must be electrically insulated from subsequent covering layers 25, 26 with a second thin (1 to 200 nm thick) insulator 24. Examples of suitable insulating materials include $SiO_2$ (silicon dioxide), $Si_3N_4$ (silicon nitride), as well as any inorganic or organic semiconductors with a bandgap of at least 2.5 eV. Geometric definition of the p-channel FET gates can be realized, for example, with known lithography-based techniques, such as wet etching, dry etching or, lift off.

(f) The low-lying layers 21–24 are covered with a second conductive layer 25 that is capable of injecting electrons into an organic semiconductor. Preferred materials are calcium (Ca) or aluminum (Al). To improve electron transport and injection properties of the electron-injecting material 25, an additional layer can be deposited under the electron-injecting material 25. Preferred electron-transport materials 25 include $Alq_3$, aluminum-tris(8-hydroxichinoline), and PBD, (2-(4-biphenylyle)-5-(4-tert-butyle-phenyle)-1,3,4-oxadiazole. The conducting electron-injection layer 25 is also used as an electronic interconnect. Its geometric definition can be realized, for example, with known, lithography-based techniques used in semiconductor technology.

(g) In areas where the conducting electron-injection material 25 and hole-injection material 21 should be electrically connected, it is necessary to provide the required openings in all layers 22–24 above the hole-injecting layer. This can be realized, for example, with known, lithography-based techniques used in semiconductor technology.

(h) If light needs to be transported along the horizontal direction x of the substrate 20, a layer 26 of optically transparent material can be deposited and geometrically defined. The index of refraction of this layer 26 should be close to the index of refraction of the electron-injection material 25, which should be optically transparent for this purpose. This ensures efficient optical coupling between the light-guiding structures and the organic semiconductor 23, in which light is generated or detected. If only a very narrow spectral range of light needs to be transported, a wave-guide structure can be employed, requiring a matched layer thickness of 100 to 2000 nm. For a wider spectral range, as produced for example by an LED, a light-guiding structure with a thickness of 1 micrometer up to several millimeters is more appropriate. Preferred materials for the waveguide or light guide 26 are polymers such as PMMA (poly methyle acrylate), PC (poly carbonate), polyimide or PVC (poly vinyl chloride), or Sol-Gelmaterials such as Ormocer®. The geometrical definition of these waveguiding or light-guiding structures preferably occurs with a replication process such as hot embossing, UV casting, rubber stamping or injection molding.

The geometrical definition of areas with polymeric organic semiconductors is not only possible with the lithography-based techniques known from semiconductor technology. Organic semiconductors 23 can also be selectively deposited in thin layers by alternate, inexpensive techniques such as ink jet printing, screen printing, rubber-stamping or micro-molding (cf. H. Sirringhaus, T. Kawase and R. H. Friend, "*Emerging Methods for Micro- and Nanofabrication—High-Resolution Ink-Jet Printing of All-Polymer Transistor Circuits*", MRS Bulletin—Materials Research Society, Vol. 26, pp. 539–543, 2001).

The manufacturing method described above is only a preferred, simple example. A person skilled in the art having knowledge of the invention will be able to derive further processes for manufacturing a microsystem 1 according to the invention. The common characteristics of these manufacturing methods is the capability of developing controlled thicknesses of material (several 10 nm up to a few micrometers) in controlled geometrical patterns (spatial resolution of some 10 nm to several 10 micrometers).

Application Examples

1. Active-Pixel LED and Display

Figures 1A, 1B:
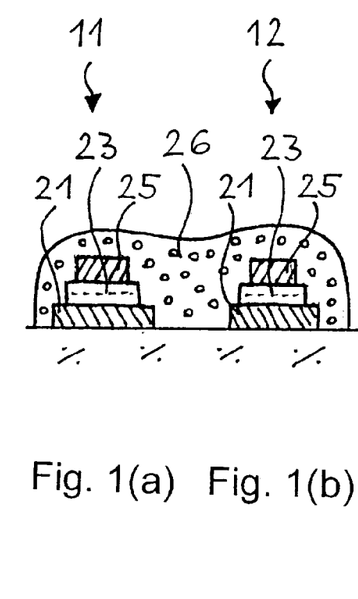
FIG. 1 shows schematic cross sections through an integrated-optical microsystem according to the invention, with various integrated-optical components.
Figure 1C:
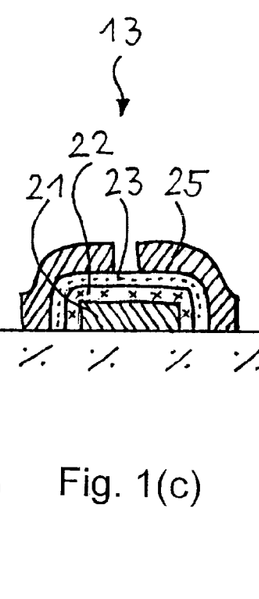
Figure 1D:
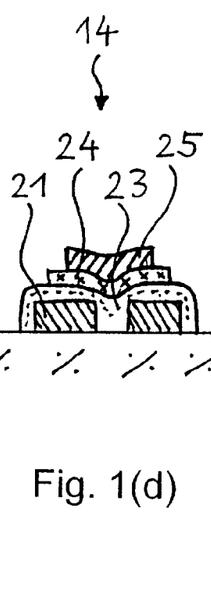
Figure 1E:
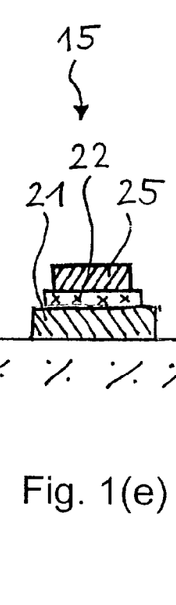
Figure 1F:
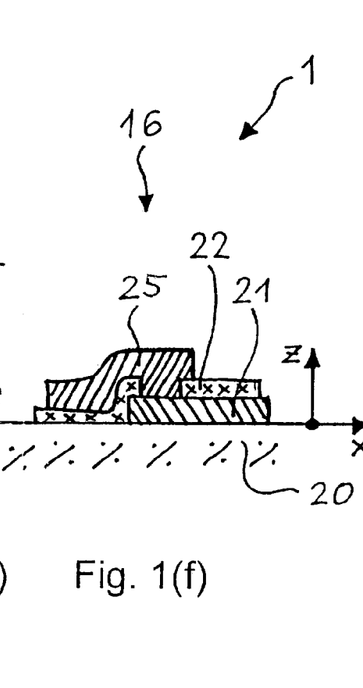
Figure 2:
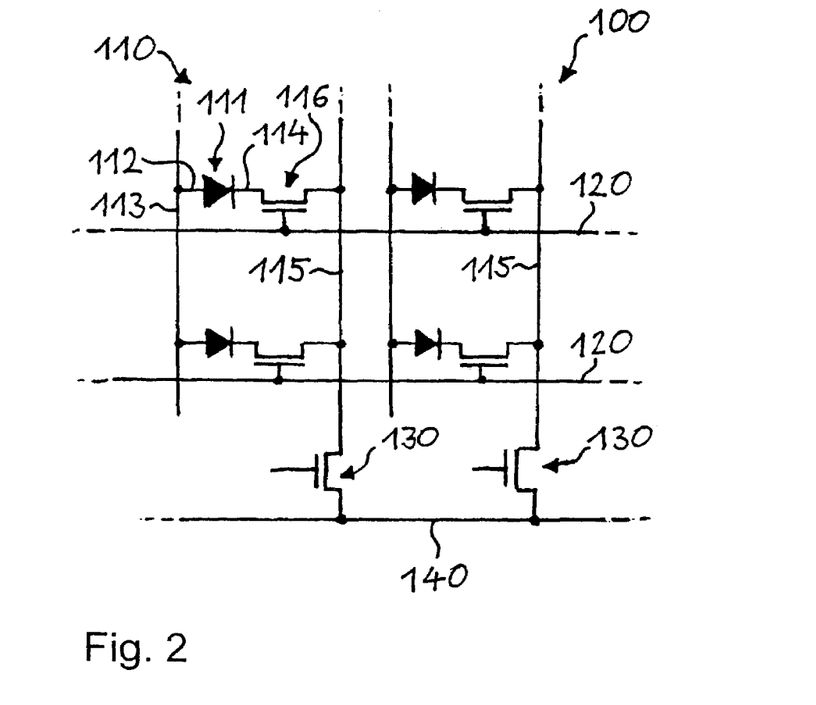
FIG. 2 shows a schematic circuit diagram of a first embodiment of a display according to the invention.

In an active-pixel-display unit cell 110, one terminal 112 of a light-emitting-diode (LED) structure 111 is connected to a fixed-voltage line 113, while the other terminal 114 is connected via a transistor switch 116 to a variable-voltage line 115, as schematically illustrated in FIG. 2. A two-dimensional array 100 of one or more of such LED/transistor unit cells 110 is provided with at least one row-select line 120 that is connected to all gates of the transistor switches 116 in a row. The transistor switches 116 of each row have their drain contacts connected to a column line 115. Each column line 115 is connected via a column-select transistor 130 to a common signal line 140.

Figure 3:
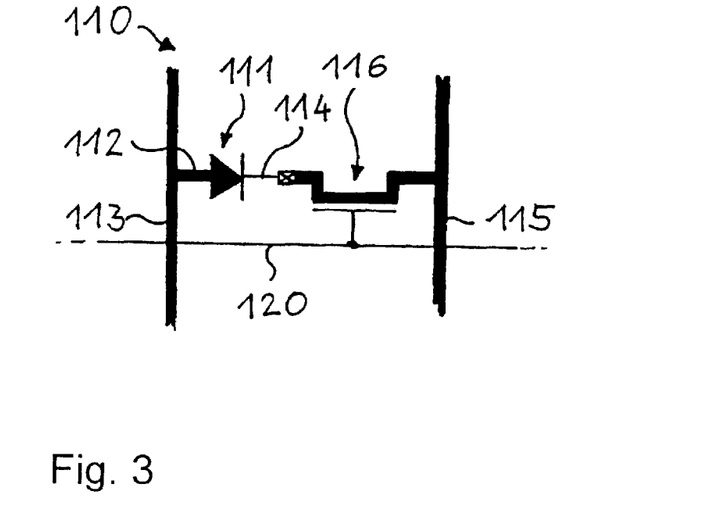
FIG. 3 schematically shows a pixel of an active display according to the invention.
Figure 4:
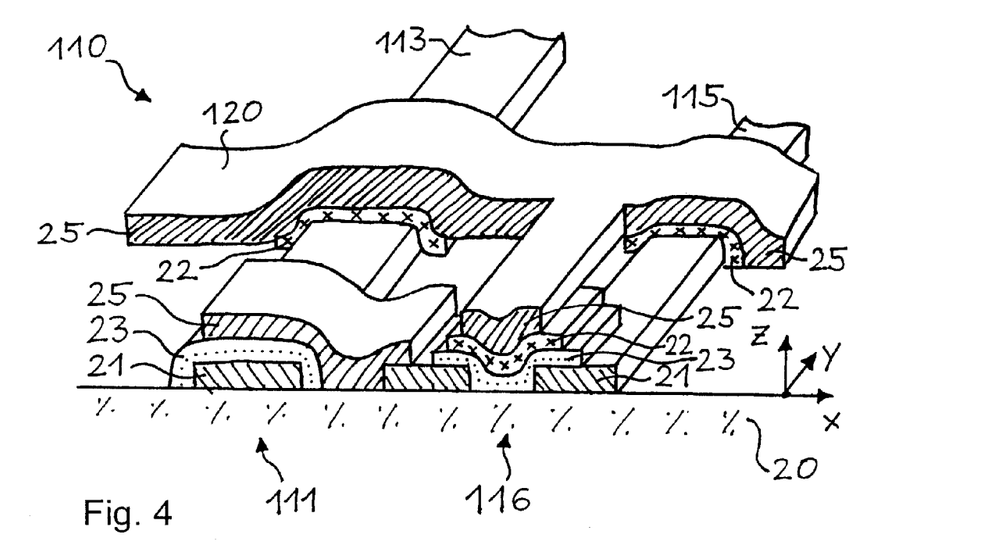
FIG. 4 shows a schematic perspective view of a preferred implementation of the active pixel of FIG. 8.

FIG. 3 shows a preferred realization of an active-pixel-LED-display unit cell 110, making use of the fabrication process explained with reference to FIG. 1. A preferred implementation of the same active-pixel-LED-display unit cell 110 is shown in a perspective view in FIG. 4. In FIGS. 3 and 4, identical reference signs are used for elements already introduced with reference to FIGS. 1 and 2.

An individual LED 111 is lighted by connecting it to the signal line 140. This is accomplished by applying the correct potential to the row-select lines 120: in the case of p-channel transistors, a negative potential must be applied, in the case of n-channel transistors, a positive potential must be applied to render the switch transistors 116 conductive. The column line 115 of the LED 111 that needs to be lighted is connected via the appropriate column-select transistor 130 to the common signal line, by applying a suitable potential to the gate of this column-select transistor 130, in the same way as for the row-select transistors 116. In this way, an electrically conductive path is created from the fixed-voltage line 113 to the signal line 140 through the LED 111 that needs to be lighted.

The intensity of the LED is controlled by the amount of current that flows through it, and this can be controlled with the signal line. If the total resistance of the current path is well known in advance (if the fabrication process is well controlled), then it is sufficient to apply a suitable potential to the signal line to achieve a predictable brightness of the LED. Otherwise, an electronic circuit is required in the signal that sources the required amount of current (so-called current-source circuit).

If only one LED 111 needs to be illuminated at a given time, all transistors are switched off except for the corresponding row-select transistor 116 and the corresponding column-select transistor 130. If several LEDs in a rectangular area need to be lighted with the same brightness and at the same time, then all corresponding row-select transistors 116 and column-select transistors 130 can be switched on, while all other transistors are switched off. The current that flows through the signal line is N times as large as the current that flows through one LED, where N is the number of LEDs that are lighted at the same time.

By switching on certain patterns of the row-select transistors 116 and column-select transistors 130, it is also possible to light up corresponding two-dimensional patterns of LEDs that need not to be rectangular. By sequentially switching on all LEDs in the two-dimensional array 100 at fixed time intervals, complete sequences of moving images can be displayed. If the potential on the signal line 140 is varied only between two voltages, then only line images are displayed; if the potential on the signal line is varied continuously, gray-level images are displayed. Grey-level images can also be displayed with a fixed potential or a fixed current value at the signal line 140, by employing different times for which the individual LEDs are switched on: a bright LED is switched on for a longer time than a darker LED.

Figure 5:
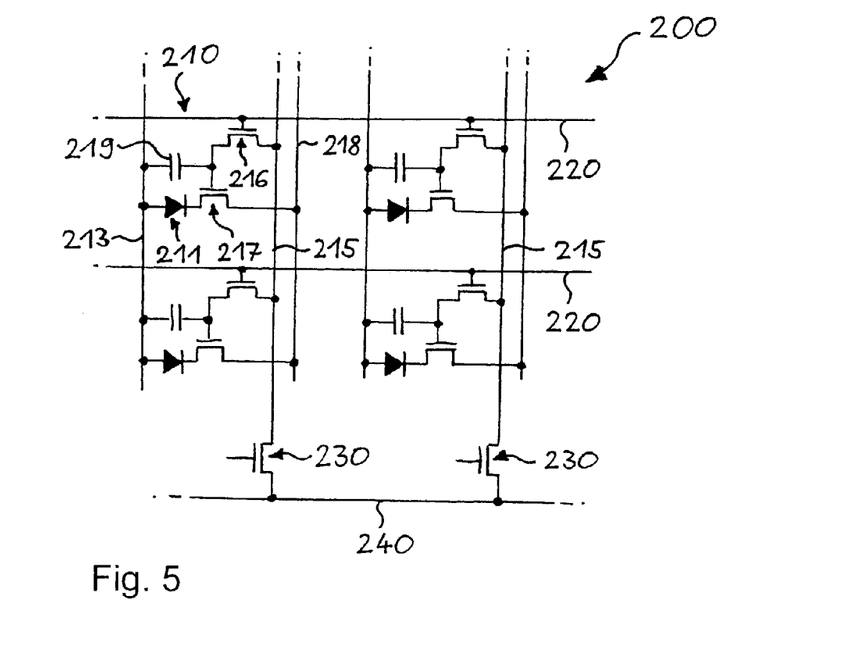
FIG. 5 shows a schematic circuit diagram of a second embodiment of a display according to the invention.

If the two-dimensional array 100 of active-pixel LEDs 110 consists of a large number of LEDs, then an individual LED 111 is only switched on for a comparatively short time. This leads to a lower overall brightness of the created image. This limitation can be overcome with the circuit 200 shown in FIG. 5, making it possible to illuminate all LEDs 211 with their appropriate brightness at the same time. This is achieved by supplying each LED 211 with a current-source transistor 217, where the current-source transistors 217 of all pixels 210 are tied to the same potential, preferably to ground on a ground line 218. The gate of each current-source transistor 217 can be programmed to a specific voltage with the row-selection mechanism 216, 220, column-selection mechanism 230, 215 and signal-line voltage mechanism 240 described above with reference to FIGS. 2–4. To improve the voltage-retention times in the pixels 210, an additional capacitance 219 can be added at the gate of the current-source transistor 217 in each pixel 210. The other terminal of the LED 211 is connected to a fixed-voltage line 213, in analogy to FIGS. 2–4.

2. Active-Pixel Photosensor and Image Sensor

Figures 6, 7:
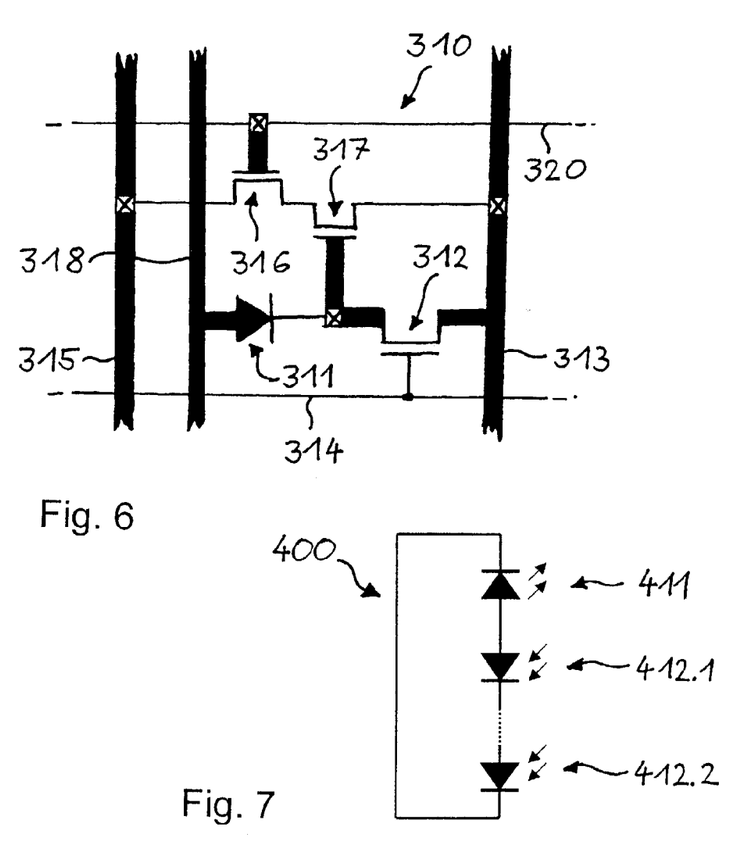
FIG. 6 schematically shows a preferred embodiment of an active pixel of a detector according to the invention.
FIG. 7 shows a circuit diagram of a simple self-powered display according to the invention.

Excellent image sensors based on photodiodes can be realized with the active-pixel-sensor (APS) architecture for silicon-based photosensors. Such an APS pixel 310 and an image sensor based on it can be realized with the process according to the invention, as illustrated in FIG. 6. A photodiode 311 is reverse-biased to a reference voltage on a reference-voltage line 313 with a reset transistor 312, the gate of which is connected to a reset line 314. The other terminal of the photodiode 311 is connected to a ground line 318. The incident light partly discharges the photodiode 311 to a voltage value that can be measured with a source follower comprising a source-follower transistor 317 and a load resistor that is common to all APS pixels 310 at the end of a common signal line 315. The individual pixels 310 are connected to the common signal line 315 with a pass transistor 316, whose gate is connected row-wise to a row-selection line 320. Addressing occurs similarly to the active-pixel LEDs 210 described above with reference to FIGS. 2–5.

3. Active Lighting for Advertising, Fashion and Security

Since it is possible, according to the invention, to produce integrated optoelectronic systems also on large surfaces at low cost, there are many applications in advertising, fashion and security, on various surfaces such as business cards, letterheads, large and small posters, shopping bags, garments (T-shirts, windbreakers, pullovers, jeans, sneakers, shoes, etc.), household items, cars, traffic signs, signal bands, and many others.

A very simple self-powered display 400 is shown in FIG. 7. It consists of one or a series connection of one or more photoemissive elements 411 and photovoltaic elements 412.1, 412.2.

Figure 8:
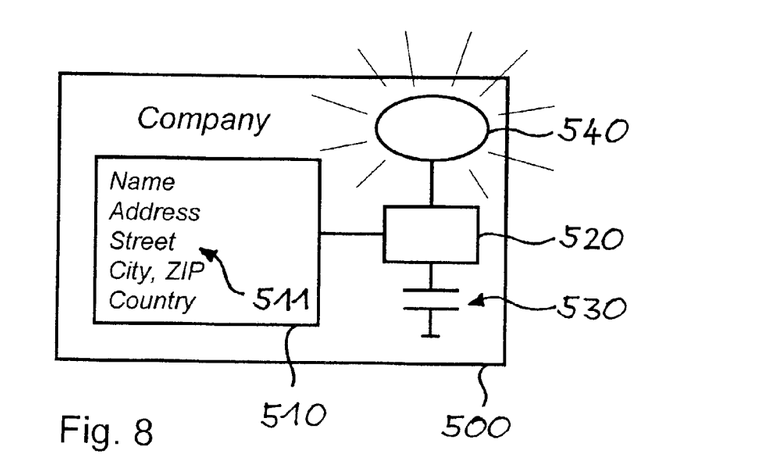
FIG. 8 schematically illustrates an integrated, self-powered display according to the invention.

A preferred realization of an integrated self-powered display 500 is illustrated in FIG. 8. It comprises one or several photovoltaic elements or cells 510 that are either connected in parallel or in series. A series connection allows for the simple generation of higher voltages. The photovoltaic cells 510 can be realized as simple rectangular shapes, or they can be realized in complex forms such as letters, digits or images. It is possible to print information 511 on the photovoltaic elements 510, as long as there is sufficient free space for the photovoltaic generation of the required electric power.

The photovoltaic elements 510 are connected to an electronic circuit 520 that carries out one or more of the following functions: voltage conversion, voltage regulation, current limitation, power management, clock generation, flashing effects, etc. The electronics 520 can be connected to an integrated capacitive device 530 for temporary power filtering and storage (during periods of insufficient illumination of the photovoltaic element).

The electronics 520 feeds power to one or more photoemissive surfaces 540 that can be arbitrarily shaped. It is possible to print opaque structures on the photoemissive surfaces 540. The electronics 520 can drive the photoemissive structures 540 either continuously or temporally intermittently for effects such as flashing, running lights or simulated movement. It is also possible to integrate a display 100, 200 as described above with reference to FIG. 2 or 5, on which moving images can be shown.

4. Integrated-Optical Microsystems for Measurements

A large number of optical measurement techniques exist that can be implemented with the fabrication process according to the invention. They share the basic principle of operation that a light source is emitting light under the control of an electronic circuit, this light interacts with the object under study to produce light that carries the desired information, a photodetector detects this light, and an electronic circuit extracts the information from the detected light and passes it on for further processing.

The integrated-optical microsystems according to the invention are especially useful for the realization of many types of optical measurement principles, because the microsystem can be bent into a large variety of three-dimensional shapes after planar fabrication, provided a flexible substrate is used.

Figure 9:
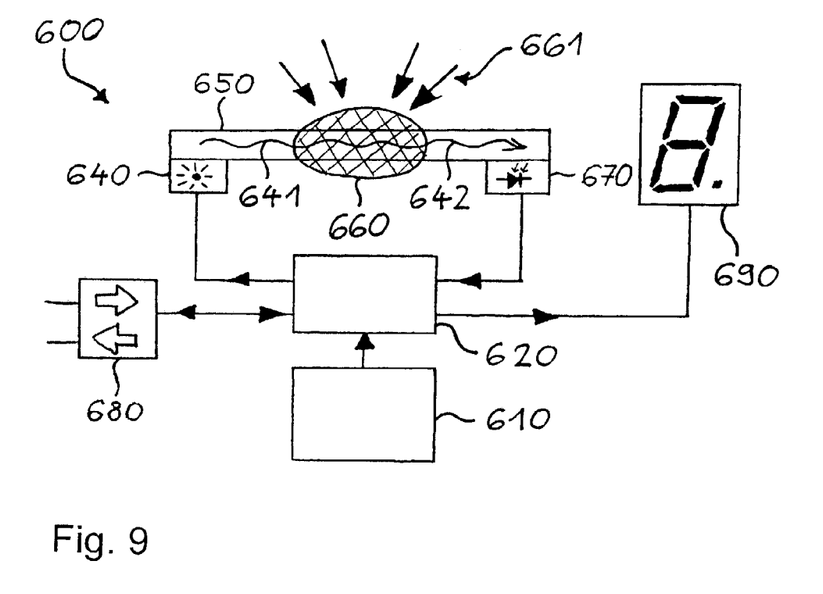
FIG. 9 shows a schematic diagram of an integrated-optical microsystem according to the invention.

A particularly powerful class of integrated-optical microsystems that had to be realized until now with hybrid fabrication methods is described in R. E. Kunz, "*Totally Integrated-optical Measuring Sensors*", Proc. SPIE, Vol. 1587, pp. 98–113, 1992. These and other integrated-optical microsystems 600 can be implemented with the process described in this invention, as illustrated in FIG. 9.

A power-supply unit 610 provides electric power, either by drawing it from a storage device such as a battery or a charged capacitor, or by producing it with an integrated photovoltaic device comprising a series connection of one or more photodiodes under illumination that are used as photovoltaic elements (cf. FIG. 7, reference signs 412.1, 412.2). This electric power is managed and distributed by an electronic control circuit 620 for controlling the device 600, converting voltages, limiting electrical current, acquiring and processing signals, managing power, controlling the display of results, etc. The circuit 620 powers one or more light-emitting devices 640 (LEDs, superluminescent diodes, laser diodes, etc.). If required by the optical measurement principle, emitted light 641 can already be modulated by the driving circuit 620, for example by carrying out a temporal amplitude modulation. The emitted light 641 is guided with a suitable light guide or waveguide 650 near the surface of the integrated-optical microsystem 600 to a region of interaction 660. The light 641 interacts with the objects 661 under study according to the effects described in R. E. Kunz's paper, e.g., it is influenced by the objects 661 in intensity, polarization, wavelength etc. The light 642 that is guided further carries now information in the form of changed position, modified intensity, modified polarization, modified wavelength, modified contrast, altered temporal modulation properties, etc. At the end of the light guide or waveguide 650 are arranged one or more photodetectors 670 that detect the light 642 carrying the desired information. Depending on the type of information, a suitable type of detection principle must be chosen, as described in the literature.

The measurement results are processed and interpreted by the electronic circuit 620, producing a measurement result that is either displayed locally or that is transmitted outside the optical microsystem 600 with a suitable interface 680, using electrical, optical or other transmission principles. The interface may, example, have electrical contacts or an optical interface device comprising at least one photoemissive and one photodetecting element. A display 690 of the microsystem 600 can be realized as one or more indicator LEDs of the same or of different color, as numeric (seven-segment) display, as alphanumeric display or as a display with full graphic capability according to FIG. 2 or 5. The co-integration of one or several of these various types of displays with the optical microsystem 600 is possible with the fabrication process according to the invention and illustrated with reference to FIG. 1.

5. Sheet Scanner (Ultimate Flat-Bed Scanner)

Figure 10:
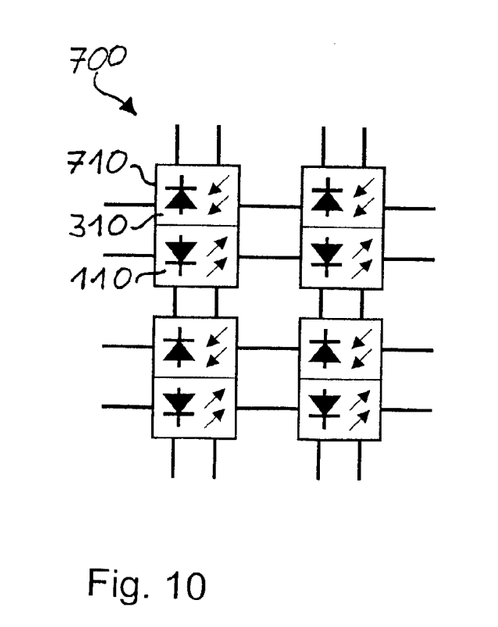
FIG. 10 schematically illustrates a monolithic sheet scanner of electronic paper according to the invention.

An optoelectronic scanner that is as thin as a sheet of paper can be realized with the components described above, according to the invention. It comprises a two-dimensional array 700 of one or more unit cells 710, each realized as a combination of one or more active-pixel light-emission cells 110 (or 210) such as discussed with reference to FIG. 2 (or 5, respectively), and one or more APS light sensing cells 310 such as discussed with reference to FIG. 6. The array 700 is schematically illustrated in FIG. 10. Each active-pixel LED 110 and each APS sensor pixel 310 can be addressed individually, making use of appropriate row-selection and column-selection mechanisms described above.

For each scanner unit cell 710 the scanning process consists of resetting first the APS pixel 310, then switching on the pixel LED 110 for illumination of the local environment for a certain time, and finally reading out the APS pixel 310. If a reflecting (bright) object was lying next to the scanner cell 710, then a high reflection value will be read; if the object was locally dark (in printed areas), a lower reflection value will be read. The two-dimensional pattern of reflection values represent an image of the object (e.g., a document) close to the surface of the scanner cells 710. For improved depth of field and improved geometric registration, microlenses or gradient-index (GRIN) lenses can be placed over the scanner unit cells 710, as is known from facsimile scanning machines.

Depending on the application, the available electrical power and the desired scanning time, the LEDs 110 are lighted sequentially (one at a time), larger numbers such as complete lines or extended areas are lighted at a time, or all LEDs 110 are lighted simultaneously.

6. Electronic Paper

The sheet scanner 700 described above and illustrated in FIG. 10 can also be used as electronic paper which, together with an appropriate pen, is part of an electronic writing equipment. The pen for writing on the paper can either be active or passive.

A passive pen has a well-reflecting tip, realized for example with retroreflecting microprisms or microspheres, or with a metallic or white coating. The sheet scanner is operated as for the scanning purpose described above. At the position of the writing pen's tip a high reflection value will be read. The corresponding pixel LED 110 will be illuminated and stays illuminated, showing the locations where the pen has been. The scanning operation with a passive pen consumes a significant amount of electrical power because each position measurement requires the illumination of a large number of pixel LEDs.

By using an active pen, the power consumption can be significantly reduced. The active pen has a small area at the tip with a diameter of, e.g., 5 mm or less, from which light is emitted. This light is generated in the pen, for example with an LED. The scanning operation comprises the steps of resetting the APS sensing pixels 310 and reading out the values after a short exposure time of, e.g., less than 100 ms. In locations where the pen's tip has emitted enough light to create an appreciable signal in the APS pixels 310, the pixel LEDs 110 are switched on continuously, to indicate where the pen has been.

To reduce the scanning time and the power consumption, it is sufficient to scan the environment of the pen's last position, since the pen will be moved with limited speed over the scanning surface. Only when the pen has been lifted from the scanning surface is it necessary to inspect again the complete area.

7. Pocket Calculator, Data Entry and Display System

A monolithic pocket calculator, data entry and data display system can be realized with the components described above, according to the invention.

The keys are realized as scanner unit cells 710, as described above. When a finger comes close to the surface, the local reflection increases, and it can be detected that "the key has been pressed". The display unit can either consist of traditional seven-segment numeric LEDs or a fine-grained rectangular array of LEDs for higher-resolved display of numerals, characters and images. An integrated electronic circuit provides the power management, the key reading functions, drives the display, carries out all necessary calculations and provides for electrical, optical or other interfaces, as described above.

This invention is not limited to the preferred embodiments described above, to which variations and improvements may be made, without departing from the scope of protection of the present patent.

LIST OF REFERENCE NUMERALS

1 Microsystem
11 Integrated light-emitting device
12 Integrated photodetector or photovoltaic cell
13 Integrated n-channel FET
14 Integrated p-channel FET
15 Integrated capacitor
16 Interconnect region
20 Substrate
21 Hole injection layer
22 First insulation layer
23 Active organic semiconductor layer
24 Second insulation layer
25 Injection layer
26 Light-guiding or wave-guiding layer
100 Active-pixel display
110 Active-pixel-display unit cell
111 LED structure
112, 114 Terminals of LED structure
113 Fixed-voltage line
115 Variable-voltage line
116 Row-select transistor
120 Row-select line
130 Column-select transistor
140 Common signal line
200 Active-pixel display
210 Active-pixel-display unit cell
211 LED structure
213 Fixed-voltage line
215 Variable-voltage line
216 Row-select transistor
217 Current-source transistor
218 Ground line
219 Capacitance
220 Row-select line
230 Column-select transistor
240 Common signal line
310 APS pixel
311 Photodiode
312 Reset transistor
313 Reference-voltage line
314 Reset line 315 Common signal line
316 Pass transistor
317 Source-follower transistor
318 Ground line
320 Row-select line
400 Self-powered display
411 Photoemissive element
412 Photovoltaic element
500 Self-powered display
510 Photovoltaic element
511 Information on photovoltaic element
520 Electronic circuit
530 Integrated capacitive device
540 Photoemissive surface
600 Integrated-optical microsystem
610 Power-supply unit
620 Electronic control circuit
640 Light-emitting device
641 Emitted light
642 Guided light carrying information
650 Light guide or waveguide
660 Region of interaction
661 Measurand
670 Photodetector
680 Interface
690 Display
700 Sheet scanner
710 Unit cell

What is claimed is:

1. An integrated-optional microsystem comprising
a substrate and
a plurality of compoments arranged on said substrate,
at least a first of said components comprising a layer of organic semiconductor material, wherein
said first component and a second, different component are monolithically integrated on said substrate,
said first component and said second component each comprise a plurality of layers,
said layers being selected from the group consisting of
a first electrically conductive layer and a second electrically conductive layer, one of said electrically conductive layers being a hole injection layer and one of said electrically conductive layers being an electron injection layer,
an electrical insulation layer,
an organic semiconductor layer, and
a light-guide or wave-guide layer, and
said layers being selectively deposited on said substrate in the following order:
first said first electrically conductive layer so that said first electrically conductive layer is closest to said substrate,
then said electrical insulation layer and/or said organic semiconductor layer in an arbitrary order,
then said second electrically conductive layer, and
then said light-guide or wave-guide layer so that said light-guide or wave-guide layer is at the largest distance from said substrate, and
said first component and said second component each comprise a corresponding layer with identical physical and chemical characteristics.

2. The integrated-optical microsystem (1) according to claim 1, wherein said first component and said second component each comprise a plurality of corresponding layers, said corresponding layers being mutally arranged in the vertical direction in the same order.

3. The integrated-optical microsystem (1) according to claim 1, wherein said hole injection layer comprises indium tin oxide, said electron injection layer comprises calcium or aluminum, said electrical insulation layer comprises silicon dioxide and/or silicon nitride, said organic semiconductor layer comprises poly (para phenylene), poly (para phenylene vinylene), aluminum tris-(8, hydroxylquinoline), tetracene or pentacene, and/or said light-guide or wave-guide layer comprises poly methyle acrylate, poly carbonate, polyimide or poly vinyl chloride or a sol-gel material.

4. The integrated-optical microsystem according to claim 1, wherein said first component comprises a structure with
said first electrically conductive layer deposited closest to said substrate,
said organic semiconductor layer deposited above said first electrically conductive layer,
said second electrically conductive layer deposited above said organic semiconductor layer,
and preferably said light-guide or wave-guide layer deposited above said second electrically conductive layer,
and is usable as an integrated light-emitting device, an integrated photodector or an integrated photovoltaic cell.

5. The integrated-optical microsystem according to claim 1, wherein said first component comprises a structure with
the first electrically conductive layer deposited closest to said substrate,
the electrical insulation layer deposited above said first electrically conductive layer,
the organic semiconductor layer deposited above said electrical insulation layer, and
two separate second electrically conductive layers each deposited above said organic semiconductor layer,
and is ussable as an integrated n-channel field-effect transistor, said first electrically conductive layer being the gate and said two separate second electrically conductive layers being the drain and source.

6. The integrated-optical microsystem according to claim 1, wherein said first component comprises a structure with
two separate first electrically conductive layers each deposited closest to said substrate,
said organic semiconductor layer deposited above said first electrically conductive layers,
said electrical insulation layer deposited above said organic semiconductor layer, and
said second electrically conductive layer deposited above said electrical insulation layer,
and is usable as an integrated p-channel field-effect transistor, said two separate first electrically conductive layers being the drain and source and said second electrically conductive layer being the gate.

7. The integrated-optical microsystem according to claim 1, wherein said second component comprises a structure with
said first electrically conductive layer deposited closest to said substrate,
said electrical insulation layer deposited above said first electrically conductive layer, and
said second electrically conductive layer deposited above said electrical insulation layer,
and is usable as an integrated capacitor.

8. The integrated-optical microsystem according to claim 1, wherein said second component comprises a structure with
said first electrically conductive layer deposited closest to said substrate, two separate electrical insulation layers each deposited above said first electronically conductive layer, and said second electrically conductive layer deposited above said electrical insulation layer, and is usable as an interconnect region between said first electrically conductive layer and said second electrically conductive layer.

9. The integrated-optical microsystem according to claim 1, wherein said substrate is selected from the group consisting of crystalline silicon wafers, thin stainless steel foils, polyesters such as PET, Mylar®, polyimides such as Kapton®, polyamides such as Nylon®, polypropylene or polyethylene.

10. An integrated-optical microsystem comprising
a substrate and
a plurality of components arranged on said substrate,
at least a first of said components comprising a layer of organic semiconductor material, and
said components are selected from the group consisting of monochromatic and polychromatic light sources, photodectors, photovoltaic power generators, n-channel and p-channel field-effect transistors, resistors, capacitors, light-guiding and wave-guiding structures, interconnect regions between two electrically conductive line, and derived sensing devices for the measurement of pressure, magnetic or electric fields or chemical or bio-chemical substances,
wherein said first compoment and a second, different component are monolithically integrated on said substrate.

11. An integrated-optical microsystem comprising a substrate and
a plurality of components arranged on said substrate,
a first of said components being a light-emitting diode structure comprising a layer of organic semiconductor material, a first terminal of said light-emitting diode structure being connected to a fixed-voltage line,
and a second of said components being a switch transistor via which a second terminal of said light-emitting diode structure is connected to a variable-voltage line.

12. An integrated-optical microsystem comprising
a substrate and
a plurality of components arranged on said substrate,
a first of said components being a light-emitting diode structure comprising a layer of organic semiconductor material, a first terminal of said light-emitting diode being connected to a ground line,
a second of said components being a source-follower transistor connecting a reference-voltage line with a signal line, and
a third of said components being a reset transistor via which a second terminal of said light-emitting diode structure is connected to said reference-voltage line and to the gate of said source-follower transistor.

13. An integrated-optical microsystem comprising
a substrate and
a plurality of components arranged on said substrate,
a first of said components being a photoemissive element comprising a layer of organic semiconductor material, and
a second of said components being a photovoltaic element.

14. An integrated-optical microsystem comprising
a substrate and
a plurality of components arranged on said substrate,
a first of said components being a light-emitting device comprising a layer of organic semiconductor material,
a second of said components being a light guide or waveguide for guiding light emitted by said light-emitting device, and
a third of said components being a photodetector for detecting light exiting from a region of interaction in a vicinity of said light guide or waveguide.

15. The integrated-optical microsystem according to claim 1, wherein said first component and said second component each comprise a correspond layer with identical thicknesses and identical chemical and physical consistencies.

16. The integrated-optical microsystem according to claim 11, wherein said substrate is selected from the group consisting of crystalline silicon wafers, thin stainless steel foils, polyesters such as PET, Mylar®, polyimides such as Kapton®, polyamides such as Nylon®, polypropylene or polyethylene.

17. The integrated-optical microsystem according to claim 12, wherein said substrate is selected from the group consisting of crystalline silicon wafers, thin stainless steel foils, polyesters such as PET, Mylar®, polimides such as Kapton®, polyamides such as Nylon®, polypropylene or polyethylene.

18. The integrated-optical microsystem according to claim 13, wherein said substrate is selected from the group consisting of crystalline silicon wafers, thin stainless steel foils, polyesters such as PET, Mylar®, polyimides such as Kapton®, polyamides such as Nylon®, polypropylene or polyethylene.

19. The integrated-optical microsystem according to claim 14, wherein said substrate is selected from the group consisting of crystalline silicon wafers, thin stainless steel foils, polyesters such as PET, Mylar®, polyimides such as Kapton®, polyamides such as Nylon®, polypropylene or polyethylene.

* * * * *